United States Patent
LV et al.

(10) Patent No.: US 10,644,270 B2
(45) Date of Patent: May 5, 2020

(54) OLED DISPLAY PANEL AND METHOD FOR MANUFACTURING THE SAME

(71) Applicant: BOE Technology Group Co., Ltd., Beijing (CN)

(72) Inventors: Zhijun L V, Beijing (CN); Feng Zhang, Beijing (CN); Shizheng Zhang, Beijing (CN); Ning Dang, Beijing (CN); Liwen Dong, Beijing (CN); Wenqu Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/157,675

(22) Filed: Oct. 11, 2018

(65) Prior Publication Data
US 2019/0123309 A1   Apr. 25, 2019

(30) Foreign Application Priority Data
Oct. 23, 2017   (CN) .......................... 2017 1 0992890

(51) Int. Cl.
*H01L 29/08* (2006.01)
*H01L 51/56* (2006.01)
*H01L 51/00* (2006.01)
*H01L 51/52* (2006.01)

(52) U.S. Cl.
CPC .......... *H01L 51/56* (2013.01); *H01L 51/0096* (2013.01); *H01L 51/5246* (2013.01); *H01L 51/5253* (2013.01); *H01L 51/5256* (2013.01); *H01L 2251/566* (2013.01)

(58) Field of Classification Search
CPC . H01L 51/56; H01L 51/0096; H01L 51/5246; H01L 51/5253; H01L 51/5256
USPC .............................................. 257/40, 59, 72
See application file for complete search history.

(56) References Cited

U.S. PATENT DOCUMENTS 7,436,114 B2 * 10/2008 Wang .................. H01L 27/3246
257/40

* cited by examiner

*Primary Examiner* — Tan N Tran
(74) *Attorney, Agent, or Firm* — Nath, Goldberg & Meyer; Joshua B. Goldberg; Stephanie Majkut

(57) ABSTRACT

An OLED display panel and a method for manufacturing the same are provided. By successively forming a first organic film layer, a metal film layer, and a second organic film layer on a substrate layer, a width of the metal film layer is greater than a width of the first organic film layer in a peripheral region of the OLED display panel, to form an inverted trapezoid-shaped bottom-cut structure. An included angle between an edge of the first organic film layer and the metal film layer is relatively large, and if an inorganic film layer is further formed subsequently, the inorganic film layer may have a relatively small thickness at this position, which makes it easier for a crack to occur and a fracture to appear, as such, when cutting is performed using a laser, splitting of the inorganic film layer will be terminated at this position.

15 Claims, 3 Drawing Sheets

OLED DISPLAY PANEL AND METHOD FOR MANUFACTURING THE SAME

CROSS-REFERENCE TO RELATED APPLICATIONS

The present application claims the priority of the Chinese Patent Application No. 201710992890.2, filed on Oct. 23, 2017, the contents of which are incorporated herein in their entirety by reference.

TECHNICAL FIELD

The present disclosure relates to the field of display technology, and in particular, relates to an OLED display panel and a method for manufacturing the same.

BACKGROUND

An OLED (Organic Light-Emitting Diode), due to its various advantages such as all-solid-state structure, high brightness, full angle of view, fast response, wide range of operating temperature, attainability of flexible display and the like, so far has become a next generation display technology having high competitiveness and prospects for development. An OLED device uses an organic light-emitting material and a cathode material particularly sensitive to water and oxygen, hence excessively high humidity or excessively high content of oxygen will influence the lifetime of the OLED device, and in order to effectively cut off the influence of water and oxygen to the OLED device, it is required to encapsulate the OLED device.

SUMMARY

The present disclosure provides an OLED display panel and a method for manufacturing the same.

The OLED display panel according to the present disclosure, includes a substrate layer, and further includes a first organic film layer, a metal film layer, and a second organic film layer successively formed on the substrate layer, and in a peripheral region of the OLED display panel, an orthographic projection of the metal film layer on the substrate layer covers an orthographic projection of the first organic film layer on the substrate layer, and a width of the metal film layer is greater than a width of the first organic film layer.

In an embodiment, an included angle between an edge of the first organic film layer and the metal film layer is an obtuse angle.

In an embodiment, the included angle is 120 to 130 degrees.

In an embodiment, a material of the first organic film layer is a material containing negative photosensitive groups.

In an embodiment, an orthographic projection of the second organic film layer on the substrate layer overlaps with the orthographic projection of the metal film layer on the substrate layer.

In an embodiment, the OLED display panel further includes an inorganic film layer formed on the second organic film layer and the substrate layer, and in the peripheral region of the OLED display panel, the inorganic film layer fills a space between the metal film layer and the substrate layer.

In an embodiment, the inorganic film layer has a relatively small thickness at a position where the included angle between the edge of the first organic film layer and the metal film layer is located, compared to other positions.

The present disclosure further provides a method for manufacturing an OLED display panel, the method including steps of:

coating a first organic thin film on a substrate layer, and exposing the first organic thin film by a first exposure energy using a first mask plate in a peripheral region;

depositing a metal film layer;

coating a second organic thin film on the metal film layer, and forming a pattern of a second organic film layer by a photolithography process in the peripheral region;

etching the metal film layer which is not covered by the pattern of the second organic film layer, using the pattern of the second organic film layer as a second mask plate; and developing the first organic thin film to obtain a pattern of a first organic film layer.

In an embodiment, a material of the first organic thin film is a material containing negative photosensitive groups; and the step of exposing the first organic thin film by the first exposure energy using the first mask plate in the peripheral region comprises: exposing the first organic thin film from a side of the first organic thin film distal to the substrate layer, such that a photochemical reaction is more intense at an upper layer part than at a lower layer part of an exposed region of the first organic thin film.

Further, after the step of developing the first organic thin film to obtain the pattern of the first organic film layer, the method further includes a step of:

forming an inorganic film layer on the second organic film layer and the substrate layer, by employing a CVD (Chemical Vapor Deposition) process, wherein the inorganic film layer fills a space between the metal film layer and the substrate layer in the peripheral region.

Further, after the step of developing the first organic thin film to obtain the pattern of the first organic film layer, and before the step of forming the inorganic film layer on the second organic film layer and the substrate layer, by employing the CVD (Chemical Vapor Deposition) process, the method further includes a step of:

solidifying the pattern of the first organic film layer and the pattern of the second organic film layer.

In an embodiment, the step of forming the pattern of the second organic film layer on the metal film layer by the photolithography process comprises a step of:

exposing the second organic thin film by a second exposure energy using the first mask plate to obtain the pattern of the second organic film layer after development, and the second amount of exposure is smaller than the first amount of exposure.

In an embodiment, the second exposure energy is lower than the first exposure energy by 20%-40%.

In an embodiment, the step of forming the pattern of the second organic film layer on the metal film layer by the photolithography process comprises a step of:

exposing the second organic thin film by the first exposure energy using a second mask plate different from the first mask plate to obtain the pattern of the second organic film layer after development.

In an embodiment, the step of depositing the metal film layer comprises: depositing the metal film layer at a temperature lower than a solidifying temperature of the first organic thin film.

In an embodiment, after the step of forming the inorganic film layer on the second organic film layer and the substrate layer, the method further includes: cutting an inorganic protection layer using a laser to separate the OLED display panel.

DETAILED DESCRIPTION

Technical solutions of the present disclosure rill be clearly and fully described below in conjunction with the accompanying drawings of the present disclosure. Obviously, embodiments described are a part, rather than all, of the embodiments of the present disclosure. Based on the embodiments of the present disclosure, all the other embodiments obtained without involving any inventive work by an ordinary person skilled in the art, fall within the protection scope of the present disclosure.

An organic film has numerous advantages such as low dielectric constant, good flatness, large thickness range, high transmission, good performance in blocking water vapor, etc., which has brought about fast development of technology regarding the organic film, and wide application in manufacturing an OLED display panel.

In the manufacturing process of the OLED display panel, an inorganic protection film layer is generally cut using a laser, to separate multiple OLED display panels formed in a display masterplate from each other. The inorganic protection film layer may be split, that is, cracks and gaps may be produced on the inorganic protection film layer, and the cracks and gaps may extend along the inorganic protection film layer. As such, water vapor may enter the interior of the inorganic protection film layer through the cracks and gaps, thereby affecting encapsulation effect and performance of the OLED display panel.

Figure 1:
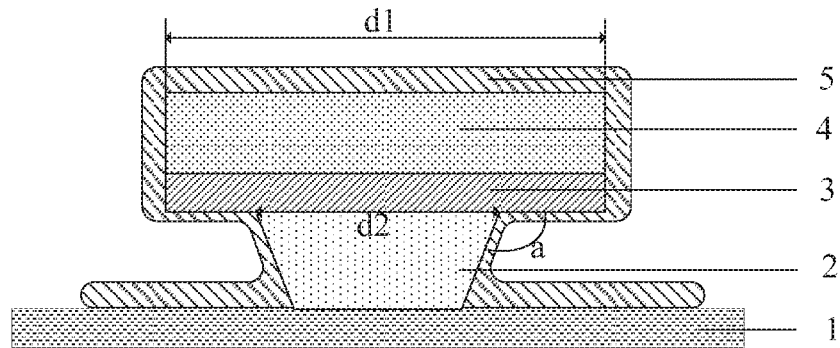
FIG. 1 is a schematic structural diagram of an OLED display panel in a peripheral region according to the present disclosure.
Figure 2:
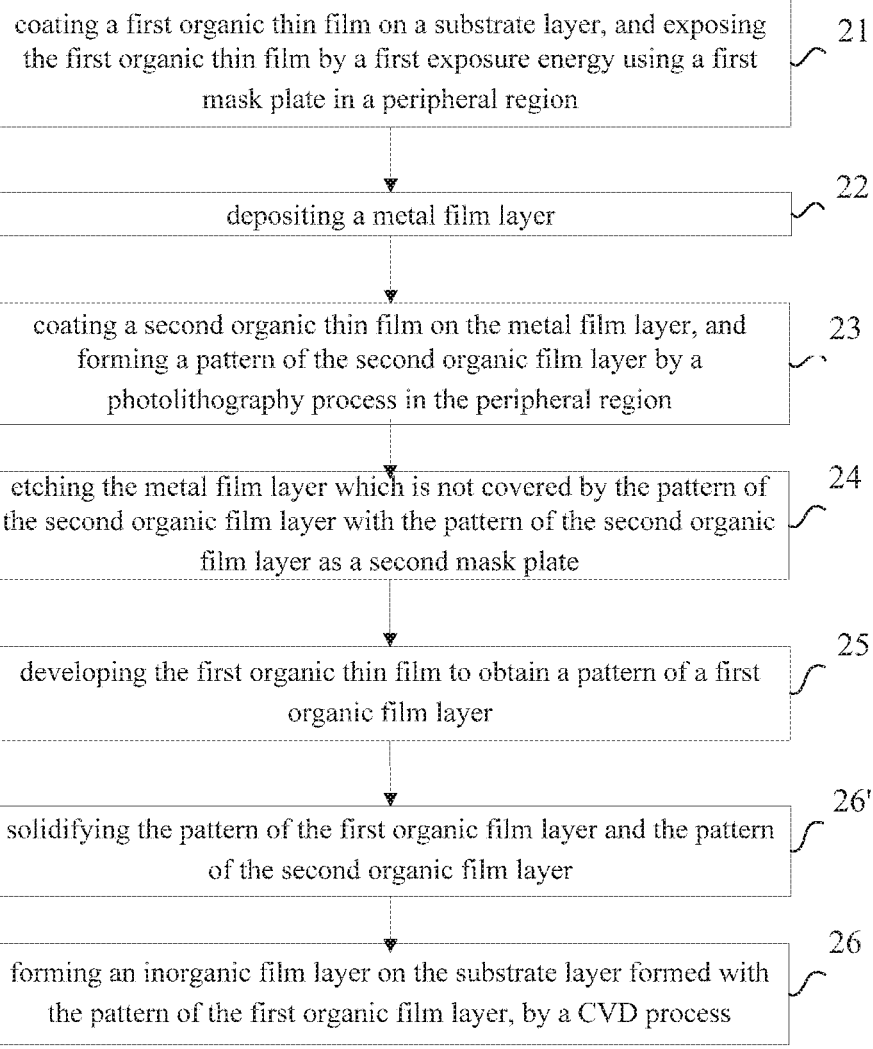
FIG. 2 is a flowchart of a method for manufacturing an OLED display panel according to the present disclosure.

FIG. 1 shows a schematic structural diagram of an OLED display panel in a peripheral region according to an embodiment of the present disclosure. As shown in FIG. 1, the OLED display panel includes a substrate layer 1, and further includes a first organic film layer 2, a metal film layer 3 and a second organic film layer 4 successively formed on the substrate layer 1. In the peripheral region of the OLED display panel, the metal film layer 3 and the second organic film layer 4 have substantially the same orthographic projection on the substrate layer 1, which covers an orthographic projection of the first organic film layer 2 on the substrate layer 1, and the metal film layer 3 has a width di greater than a maximum width d2 of the first organic film layer 2.

The peripheral region in the present application is described generally relative to a display region. For an OLED display panel, the display region is usually a region provided with pixels for performing display, and the peripheral region usually refers to a region around the display region for providing a peripheral driving circuit and performing encapsulation. In an embodiment, the peripheral region surrounds the display region, and is configured to provide a driving circuit and an encapsulation structure for pixels in the display region.

It is to be noted that, the substrate layer 1 may be formed of a flexible material, for example, PI (Polymide), and accordingly, the OLED display panel may be a flexible display panel.

The first organic film layer 2 and the second organic film layer 4 each may be made of an organic material, for example, organic resin, and the first organic film layer 2 and the second organic film layer 4 may be made of a same material or different materials.

In the OLED display panel according to the present disclosure, the first organic film layer 2, the metal film layer 3 and the second organic film layer 4 are successively formed on the substrate layer 1 in the peripheral region, and the width d1 of the metal film layer 3 is greater than the maximum width d2 of the first organic film layer 2 in the peripheral region of the OLED display panel, thereby forming a bottom-cut structure with a shape of an inverted trapezoid. Hence, an included angle between an edge of the first organic film layer 2 and the metal film layer 3 can be set to be larger than 90 degrees, and if an inorganic film layer is further formed subsequently, the inorganic film layer may have a relatively small thickness at the position of the included angle, which makes it easier for a crack to occur and a fracture to appear, as such, when cutting is performed using a laser, splitting of the inorganic film layer will be terminated at the position, so cracks and gaps will not extend into the inorganic film layer, preventing water vapor from entering inside of the OLED display panel, so that the encapsulation effect is enhanced and the lifetime of the OLED device is extended.

For example, the included angle u between an edge of the first organic film layer 2 and the metal film layer 3 is 120-130°.

As shown in FIG. 1, the orthographic projection of the second organic film layer 4 on the substrate layer 1 overlaps with the orthographic projection of the metal film layer 3 on the substrate layer 1. That is, the second organic film layer 4 has a width equal to the width of the metal film layer 3, both being d1.

Further, as shown in FIG. 1, the OLED display panel further includes an inorganic film layer 5, which is formed on the second organic film layer 4 and the substrate layer 1. In the peripheral region of the OLED display panel, the inorganic film layer 5 fills a space between the metal film layer 3 and the substrate layer 1. The inorganic film layer 5 has a small thickness at a position where the edge of the first organic film layer 2 joints with the metal film layer 3, which makes it easy for a fracture to occur, thereby preventing splitting from happening at the time of laser cutting, so that a potential further crack may be terminated at this position.

For example, the inverted trapezoid-shaped bottom-cut structure formed in the peripheral region of the OLED display panel may be provided to surround the display region of the OLED display panel, and the above-described inverted trapezoid-shaped bottom-cut structure is provided around each OLED display panel, to ensure that pixels therein are protected from possible adverse effects when forming single devices by laser cutting.

An embodiment of the present disclosure provides an OLED display apparatus including the OLED display panel described above.

The OLED display apparatus may be any product or component having a liquid crystal display function such as an electronic paper, a mobile phone, a tablet PC, a television, a digital photo frame or the like.

In the OLED display apparatus according to the present disclosure, the first organic film layer, the metal film layer and the second organic film layer are successively formed on the substrate layer, and the width of the metal film layer is greater than the width of the first organic film layer in the peripheral region of the OLED display panel, thereby forming a bottom-cut structure with a shape of an inverted trapezoid. Hence, an included angle between an edge of the first organic film layer and the metal film layer is larger than 90 degrees, that is, an obtuse angle, and if an inorganic film layer is further formed subsequently, the inorganic film layer may have a relatively small thickness at the position of the obtuse angle, which makes it easier for a crack to occur and a fracture to appear, as such, when cutting is performed using a laser, splitting of the inorganic film layer will be terminated at this position, so cracks and gaps will not extend into the inorganic film layer, preventing water vapor from entering inside of the OLED display panel, so that the encapsulation effect is enhanced and the lifetime of the OLED apparatus is extended.

An embodiment of the present disclosure also provides a method for manufacturing an OLED display panel, the method for manufacturing the OLED display panel described above. As shown in FIGS. 2 and 3a-3f, the method includes the following steps:

Step 21: coating a first organic thin film on a substrate layer I, and exposing the first organic thin film by a first exposure energy using a first mask plate in a peripheral region.

Figure 3A:
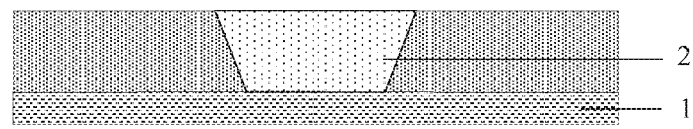
FIGS. 3a-3f are schematic diagrams showing steps of manufacturing an OLED display panel according to the present disclosure.

Specifically, the first organic thin film is coated on the substrate layer 1, and the first organic thin film contains photosensitive groups. In one embodiment of the present disclosure, description is given taking a negative resist containing negative photosensitive groups as an example. In the peripheral region of the OLED display panel, the first organic thin film is exposed by the first exposure energy using the first mask plate, resulting in a structure as shown in FIG. 3a, in which a central part of the first mask plate is a hollowed-out part, and a part at two sides is a shading part. In the peripheral region of the BLED display panel, a central part of the first organic thin film is exposed to a light illumination, such that a property of the first organic thin film changes, i.e. becomes less soluble, at the central part, where the first organic thin film corresponds to a pattern of the first organic film layer 2, while the part at two sides is not exposed to the light illumination, such that a property of the first organic thin film does not change, i.e. soluble to a solvent, at the two sides, where it can be removed in a development process. But in the present step, only exposure is performed, without performing development, that is, the first organic thin film located at the two sides, without any property change, is not removed yet, to maintain planeness of the first organic thin film, so that the metal film layer 3 is subsequently deposited.

In the present embodiment, the first organic thin film is prepared using a negative resist, the negative resist, for example, under the illumination of UV light, undergoes a photochemical reaction, causing a polymeric compound to be cross-linked into a molecular structure insoluble to an alkaline developer, and the part not exposed to the light, being soluble in the developer, is developed, and since the photochemical reaction is more intense at an upper layer than at a lower layer of the exposed region of the negative resist, after a subsequent development, a pattern of the first organic film layer 2 having an inverted trapezoid-shaped bottom-cut structure will be formed on the substrate layer 1.

Step 22: depositing a metal film layer.

Specifically, the metal film layer 3 is deposited on the first organic thin film which is already exposed but not developed. Since the first organic thin film may be carbonized at a high temperature, thereby contaminating a sputtering chamber, in order to prevent contamination of the sputtering chamber, the metal film layer 3 may be deposited at a low temperature, that is, the metal film layer 3 may be deposited at a temperature lower than a solidifying temperature of the first organic thin film.

The solidifying temperatures of the first organic thin film may be different according to different specific materials of the first organic thin film. Generally, the solidifying temperature of the first organic thin film is in a range of about 230-240° C., therefore, in this step, the metal film layer 3 is deposited at a temperature lower than 240° C., for example, a process temperature for depositing the metal film layer 3 is controlled to be 180° C. It is to be noted that, the low temperature deposition process will not bring any adverse influence on the deposition of the metal film layer 3.

Figure 3B:
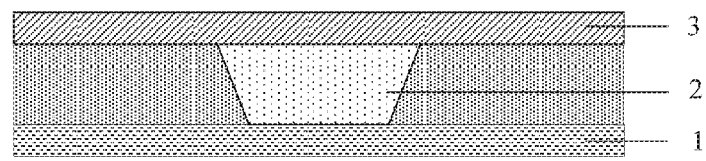

With Step 22, a structure as shown in FIG. 3b can be obtained.

Step 23: coating a second organic thin film on the metal film layer 3, and forming a pattern of a second organic film layer 4 by a photolithography process in the peripheral region.

Figure 3C:
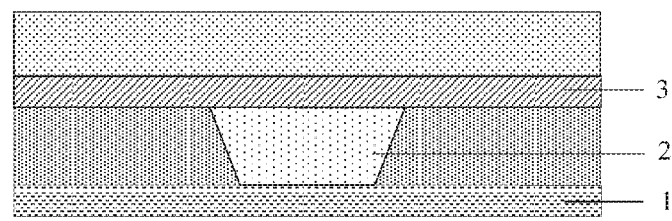
Figure 3D:
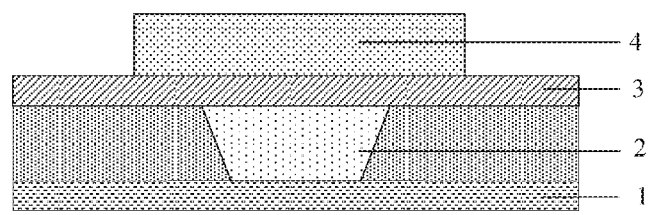

Specifically, as shown in FIG. 3c, the second organic thin film is coated on the metal film layer 3, and then, as shown in FIG. 3d, the second organic thin film is exposed by a second a exposure energy using the first mask plate and is developed, resulting in a pattern of the second organic film layer 4 after the development, in which the second exposure energy is smaller than the first amount of exposure.

For example, the second exposure energy is lower than the first exposure energy by 20%-40%.

Referring to FIG. 1, although the maximum width d2 of the pattern of the first organic film layer 2 is different from the width dl of the pattern of the second organic film layer 4, yet in the present step, one mask plate (that is, the first mask plate) may be used, and the maximum width d2 of the pattern of the first organic film layer 2 and the width d1 of the pattern of the second organic film layer 4 are controlled by controlling the exposure energy, thereby reducing the amount of the mask plates and decreasing the production cost. For example, in Step 21, the first organic thin film may be overexposed using the first mask plate, and the first exposure energy may be used, while in the present step, the second organic thin film may be normally exposed still using the first mask plate, and the second exposure energy may be used. The first exposure energy may be 140% of the second exposure energy.

It is to be noted that, one skilled in the art may know that the pattern of the second organic film layer 4 may also be formed by using another mask plate different from the first mask plate and applying the same exposure energy.

In the present disclosure, the second organic thin film may be made of a same material as that of the first organic thin film, which may be a material containing negative photosensitive groups or a material containing positive photosensitive groups, which is not limited thereto.

Step 24: etching the metal film layer 3 which is not covered by the pattern of the second organic film layer 4, using the pattern of the second organic film layer 4 as a second mask plate.

Specifically, the metal film layer 3 which is not covered by the pattern of the second organic film layer 4 may be etched away by employing wet etching, to cause an edge of the metal film layer 3 to be aligned with an edge of the pattern of the second organic film layer 4.

Etching the metal film layer 3 using the pattern of the second organic film layer 4 as the second mask plate, can further save one mask plate, and obtain a pattern of the metal film layer 3 with a same shape as the pattern of the second organic film layer 4, thereby simplifying the process.

Figure 3E:
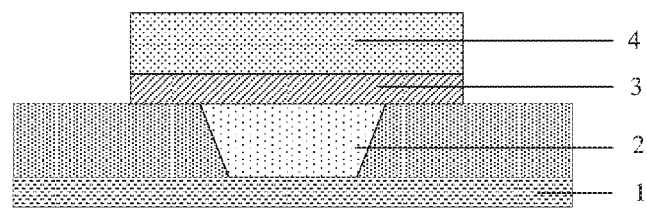

With Step 24, a structure as shown in FIG. 3e can be obtained.

Step 25: developing the first organic thin film, obtaining a pattern of a first organic film layer 2.

Figure 3F:
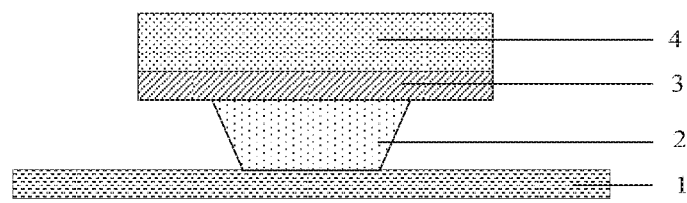

Specifically, as shown in FIG. 3f, the first organic thin film in an exposure region (that is, the first organic thin film at the two sides) is removed, thereby obtaining the pattern of the first organic film layer 2.

It can be seen from Steps 21-25 that, in the method for manufacturing the OLED display panel according to the present disclosure, the first organic film layer 2, the metal film layer 3, and the second organic film layer 4 are successively formed on the substrate layer 1, and the width d1 of the metal film layer 3 is greater than the maximum width d2 of the first organic film layer 2 in the peripheral region of the OLED display panel, to cause the first organic film layer 2 to form a bottom-cut structure with a shape of an inverted trapezoid. Hence, an included angle between an edge of the first organic film layer 2 and the metal film layer 3 can be relatively large, for example, 120 to 130 degrees, and if an inorganic film layer is further formed subsequently, the inorganic film layer may have a relatively small thickness at this position, which makes it easier for a crack to occur and a fracture to appear, as such, when cutting is performed using a laser, splitting of the inorganic film layer will be terminated at this position, so cracks and gaps will not extend into the film layer, preventing water vapor from entering inside of the OLED display panel, so that the encapsulation effect is enhanced and the lifetime of the OLED device is extended.

Further, after developing the first organic thin film to obtain a pattern of the first organic film layer 2 (that is, Step 25), the method may also include the following step:

Step 26: forming an inorganic film layer 5 on the substrate layer 1 formed with the pattern of the first organic film layer 2, by employing a CVD (Chemical Vapor Deposition) process.

Specifically, in the peripheral region of the OLED display panel, the inorganic film layer 5 fills a space between the metal film layer 3 and the substrate layer 1. The inorganic film layer 5 has a small thickness at a position where the edge of the first organic film layer 2 joints with the metal film layer 3, which makes it easy for a fracture to occur, thereby preventing splitting from happening at the time of laser cutting.

With Step 26, the OLED display panel as shown in FIG. 1 can be obtained.

Further, after developing the first organic thin film to obtain a pattern of the first organic film layer 2 (that is, Step 25), and before forming the inorganic film layer 5 on the substrate layer 1 formed with the pattern of the first organic film layer 2, by employing a CVD process (that is, Step 26), the method may also include the following step:

Step 26': solidifying the pattern of the first organic film layer 2 and the pattern of the second organic film layer 4.

Specifically, by the solidifying process, the organic film layers may be changed from a wet film to a dry film, causing the organic film layers to become more compact, and improving the effect of blocking water vapor.

In a TFT, a bottom-cut structure is generally regarded as a serious process failure, resulting in a failure such as a short circuit of metal wires. However, as the development of the organic film technology, in the semiconductor industry, application of this bottom-cut structure has become more important. For example, the bottom-cut structure is highly desired for a peripheral retaining wall structure in an encapsulation process of an OLED display panel.

In the OLED display panel and the method for manufacturing the OLED display panel according to the present disclosure, by forming an inverted-trapezoid-shaped bottom-cut structure in the peripheral region of the OLED display panel, the inorganic film layer is caused to have a relatively small thickness at this position, which makes it easier for a crack to occur and a fracture to appear, as such, when cutting is performed using a laser, splitting of the inorganic film layer will be terminated at this position, so cracks and gaps will not extend into the film layer, preventing water vapor from entering inside of the OLED display panel, so that the encapsulation effect is enhanced and the lifetime of the OLED device is extended. Besides, the material of the organic thin film also has advantages such as high thickness, high strength, high density and the like, which makes it easier to form a bottom-cut structure, and blocks influence of external factors on the internal structure and material of the OLED device. Moreover, the method for manufacturing the OLED display panel according to the present disclosure, uses one mask plate, forming the bottom-cut structure by adjusting the exposure energy twice, which can reduce the number of mask plates and decrease the production cost.

It should be understood that, the above embodiments are only exemplary embodiments for the purpose of explaining the principle of the present disclosure, and the present disclosure is not limited thereto. For a person skilled in the art, various improvements and modifications may be made without departing from the spirit and essence of the present disclosure. These improvements and modifications also fall within the protection scope of the present disclosure.

What is claimed is:

1. An OLED display panel, comprising a substrate layer, wherein,
    the OLED display panel further comprises a first organic film layer, a metal film layer, and a second organic film layer successively formed on the substrate layer, and
    in a peripheral region of the OLED display panel, an orthographic projection of the metal film layer on the substrate layer covers an orthographic projection of the first organic film layer on the substrate layer, and a width of the metal film layer is greater than a width of the first organic film layer,
    the OLED display panel further comprises an inorganic film layer formed on a top and side surfaces of the second organic film layer, side surfaces and a part of a bottom surface of the metal film layer, side surfaces of the first organic film layer and the substrate layer, wherein
    in the peripheral region of the OLED display panel, the inorganic film layer fills a space between the metal film layer and the substrate layer.

2. The OLED display panel according to claim 1, wherein an included angle between an edge of the first organic film layer and the metal film layer is an obtuse angle.

3. The OLED display panel according to claim 2, wherein the included angle is 120 to 130 degrees.

4. The OLED display panel according to claim 2, wherein a material of the first organic film layer is a material containing negative photosensitive groups.

5. The OLED display panel according to claim 2, further comprising an inorganic film layer formed on the second organic film layer and the substrate layer, wherein
in the peripheral region of the OLED display panel, the inorganic film layer fills a space between the metal film layer and the substrate layer.

6. The OLED display panel according to claim 5, wherein the inorganic film layer has a relatively small thickness at a position where the included angle between the edge of the first organic film layer and the metal film layer is located, compared to other positions.

7. The OLED display panel according to claim 1, wherein an orthographic projection of the second organic film layer on the substrate layer overlaps with the orthographic projection of the metal film layer on the substrate layer.

8. A method for manufacturing an OLED display panel, comprising steps of:
coating a first organic thin film on a substrate layer, and exposing the first organic thin film by a first exposure energy using a first mask plate in a peripheral region of the OLED display panel;
depositing a metal film layer;
coating a second organic thin film on the metal film layer, and forming a pattern of a second organic film layer by a photolithography process in the peripheral region;
etching the metal film layer which is not covered by the pattern of the second organic film layer, using the pattern of the second organic film layer as a second mask plate;
developing the first organic thin film to obtain a pattern of a first organic film layer, and
forming an inorganic film layer on a top and side surfaces of the second organic film layer, side surfaces and a part of a bottom surface of the metal film layer, side surfaces of the first organic film layer and the substrate layer, wherein the inorganic film layer fills a space between the metal film layer and the substrate layer in the peripheral region.

9. The method according to claim 8, wherein a material of the first organic thin film is a material containing negative photosensitive groups; and
the step of exposing the first organic thin film by the first exposure energy using the first mask plate in the peripheral region comprises: exposing the first organic thin film from a side of the first organic thin film distal to the substrate layer, such that a photochemical reaction is more intense at an upper layer part than at a lower layer part of an exposed region of the first organic thin film.

10. The method according to claim 8, wherein after the step of developing the first organic thin film to obtain the pattern of the first organic film layer, and before the step of forming the inorganic film layer on the second organic film layer and the substrate layer, by employing the CVD process, the method further comprises a step of:
solidifying the pattern of the first organic film layer and the pattern of the second organic film layer.

11. The method according to claim 8, wherein the step of forming the pattern of the second organic film layer on the metal film layer by the photolithography process comprises a step of:
exposing the second organic thin film by a second exposure energy using the first mask plate to obtain the pattern of the second organic film layer after development, wherein the second exposure energy is smaller than the first exposure energy.

12. The method according to claim 11, wherein the second exposure energy is lower than the first exposure energy by 20%-40%.

13. The method according to claim 8, wherein the step of forming the pattern of the second organic film layer on the metal film layer by the photolithography process comprises a step of:
exposing the second organic thin film by the first exposure energy using a second mask plate different from the first mask plate to obtain the pattern of the second organic film layer after development.

14. The method according to claim 8, wherein the step of depositing the metal film layer comprises:
depositing the metal film layer at a temperature lower than a solidifying temperature of the first organic thin film.

15. The method according to claim 8, wherein after the step of forming the inorganic film layer on a top and side surfaces of the second organic film layer, side surfaces and a part of a bottom surface of the metal film layer, side surfaces of the first organic film layer and the substrate layer, the method further comprises: cutting an inorganic protection layer using a laser to separate the OLED display panel.

* * * * *